(12) United States Patent
Kojima et al.

(10) Patent No.: US 11,651,881 B2
(45) Date of Patent: May 16, 2023

(54) MN—ZN FERRITE PARTICLES, RESIN MOLDED BODY, SOFT MAGNETIC MIXED POWDER, AND MAGNETIC CORE

(71) Applicant: POWDERTECH CO., LTD., Chiba (JP)

(72) Inventors: Takashi Kojima, Chiba (JP); Kazutaka Ishii, Chiba (JP); Takao Sugiura, Chiba (JP); Tetsuya Igarashi, Chiba (JP); Koji Aga, Chiba (JP)

(73) Assignee: POWDERTECH CO., LTD., Chiba (JP)

( * ) Notice: Subject to any disclaimer, the term of this patent is extended or adjusted under 35 U.S.C. 154(b) by 459 days.

(21) Appl. No.: 16/650,647

(22) PCT Filed: Sep. 27, 2018

(86) PCT No.: PCT/JP2018/036141
§ 371 (c)(1),
(2) Date: Mar. 25, 2020

(87) PCT Pub. No.: WO2019/065923
PCT Pub. Date: Apr. 4, 2019

(65) Prior Publication Data
US 2020/0251263 A1   Aug. 6, 2020

(30) Foreign Application Priority Data

Sep. 29, 2017   (JP) ............................. JP2017-190071

(51) Int. Cl.
*H01F 1/34*   (2006.01)
*H01F 1/33*   (2006.01)
(Continued)

(52) U.S. Cl.
CPC .......... *H01F 1/344* (2013.01); *C01G 49/009* (2013.01); *C01G 49/0072* (2013.01);
(Continued)

(58) Field of Classification Search
None
See application file for complete search history.

(56) References Cited

U.S. PATENT DOCUMENTS 4,372,865 A * 2/1983 Yu ..................... C04B 35/2658
                                                    252/62.62
4,664,831 A * 5/1987 Hibst ........................ H01F 1/36
                                                    252/62.62
(Continued)

FOREIGN PATENT DOCUMENTS

CN   106229104 A   12/2016
CN   106795006 A   5/2017
(Continued)

OTHER PUBLICATIONS

International Search Report and Written Opinion for related PCT App No. PCT/JP2018/036141 dated Nov. 20, 2018, 9 pgs. (partial translation).
(Continued)

*Primary Examiner* — Kevin M Bernatz
(74) *Attorney, Agent, or Firm* — Procopio, Cory, Hargreaves & Savitch LLP (57) ABSTRACT

Mn—Zn ferrite particles according to the present invention contain 44-60% by mass of Fe, 10-16% by mass of Mn and 1-11% by mass of Zn. The ferrite particles are single crystal bodies having an average particle diameter of 1-2,000 nm, and have polyhedral particle shapes, while having an average sphericity of 0.85 or more but less than 0.95.

6 Claims, 5 Drawing Sheets

(51) Int. Cl.
*H01F 1/37* (2006.01)
*H01F 27/255* (2006.01)
*C01G 49/00* (2006.01)
*C30B 29/22* (2006.01)

(52) U.S. Cl.
CPC ............... *C30B 29/22* (2013.01); *H01F 1/33* (2013.01); *H01F 1/37* (2013.01); *C01P 2004/04* (2013.01); *C01P 2004/32* (2013.01); *C01P 2004/61* (2013.01); *C01P 2004/62* (2013.01); *C01P 2004/64* (2013.01); *C01P 2006/42* (2013.01); *H01F 27/255* (2013.01); *Y10T 428/32* (2015.01)

(56) References Cited

U.S. PATENT DOCUMENTS

| | | | | |
|---|---|---|---|---|
| 4,698,289 | A * | 10/1987 | Aldrich | G03G 9/1075 |
| | | | | 252/62.59 |
| 5,806,172 | A * | 9/1998 | Okada | G11B 5/133 |
| 6,872,251 | B2 * | 3/2005 | Takaya | H01G 4/1227 |
| | | | | 117/945 |
| 8,465,898 | B2 * | 6/2013 | Iwata | G03G 9/1075 |
| | | | | 430/111.3 |
| 10,593,454 | B2 * | 3/2020 | Aga | H01F 1/344 |
| 10,825,593 | B2 * | 11/2020 | Kojima | C01G 53/006 |
| 11,014,826 | B2 * | 5/2021 | Kojima | C08K 7/18 |
| 2002/0017628 | A1 * | 2/2002 | Akimoto | H01F 1/36 |
| | | | | 252/62.56 |
| 2004/0183048 | A1 * | 9/2004 | Kobayashi | H01F 1/344 |
| | | | | 252/62.59 |
| 2011/0244389 | A1 * | 10/2011 | Kojima | G03G 9/1131 |
| | | | | 430/137.13 |
| 2016/0125987 | A1 | 5/2016 | Moon et al. | |
| 2016/0266510 | A1 * | 9/2016 | Sasaki | H01F 1/36 |
| 2017/0221619 | A1 | 8/2017 | Nishio et al. | |
| 2017/0263356 | A1 * | 9/2017 | Kusawake | H01F 1/147 |
| 2017/0301443 | A1 * | 10/2017 | Aga | C09D 7/70 |
| 2021/0002434 | A1 * | 1/2021 | Tsuzuki | C08K 3/22 |

FOREIGN PATENT DOCUMENTS

| | | |
|---|---|---|
| JP | S49019077 A | 5/1974 |
| JP | H06325918 A | 11/1994 |
| JP | 2002025816 A | 1/2002 |
| JP | 2005112665 A | 4/2005 |
| JP | 2005240138 A | 9/2005 |
| JP | 2010010529 A | 1/2010 |
| JP | 2011114321 A | 6/2011 |
| JP | 2016092403 A | 5/2016 |

OTHER PUBLICATIONS

Masthoff, L.-C., et al., Oriented Attachment of Ultra-Small Mn(1-x)ZnxFe2O4 Nanoparticles During the Non-Aqueous Sol-Gel Synthesis, CrystEngComm, 12(1), Jan. 2015, pp. 2464-2470.

Shinoda, K, et al., Processing Effects on In-Flight Particle State and Functional Coating Properties of Plasma-Sprayed Manganese Zinc Ferrite, Materials Science and Engineering B, 176, 2011, pp. 22-31.

* cited by examiner

MN—ZN FERRITE PARTICLES, RESIN MOLDED BODY, SOFT MAGNETIC MIXED POWDER, AND MAGNETIC CORE

CROSS-REFERENCE TO RELATED APPLICATIONS

This application is a U.S. National Stage entry of PCT Application No: PCT/JP2018/036141 filed on Sep. 27, 2018, which claims priority to Japanese Patent Application No. 2017-190071, filed Sep. 29, 2017, the contents of which are incorporated herein by reference.

TECHNICAL FIELD

The present invention relates to Mn—Zn ferrite particles, a resin molded body containing the ferrite particles, a soft magnetic mixed powder, and a magnetic core.

BACKGROUND ART

A switching power supply is incorporated in a power supply part of various electrical apparatuses that require a direct current power supply such as an ordinary household electrical product, an OA machine, and an industrial machine. A magnetic material used for a magnetic core (core and yoke) of a transformer constituting the switching power supply is required to have a high saturation magnetic flux density, a low coercive force, and a high magnetic permeability.

Conventionally, Mn—Zn ferrite particles which are single crystals having an average particle diameter of 0.1 μm to 30 μm and have a spherical particle shape have been proposed as the magnetic core material (see, e.g., Patent Literature 1). Patent Literature 1 describes that the saturation magnetic flux density of the Mn—Zn ferrite particles is 3880 to 3970 Gauss, a relative permeability μ' of a ring core obtained by pressure-molding the Mn—Zn ferrite particles is constant at about 32 in a frequency band of 1 to 100 MHz, but rises as exceeding 100 MHz and becomes a value close to 70 in a frequency band of 400 to 500 MHz.

A technique has been proposed in which a soft magnetic metal complex in which a soft magnetic metal powder and an insulator nanopowder are dispersed in a resin is used for an inductor (see, e.g., Patent Literature 2). Patent Literature 2 discloses that a Fe—Si—Cr powder, a Fe—Ni—Mo powder, and a Fe—Si—Al powder are used as the soft magnetic metal powder, and a ceramic nanopowder such as $Al_2O_3$, $SiO_2$ and $TiO_2$, or NiZn or NiCuZn ferrite is used as the insulator nanopowder. According to the soft magnetic metal complex, it is made possible to improve 30 voltage endurance characteristics and to maintain the magnetic permeability as compared with a case of the soft magnetic metal powder alone.

CITATION LIST

Patent Literature

Patent Literature 1: JP-A-2002-25816
Patent Literature 2: JP-A-2016-92403

DISCLOSURE OF INVENTION

Technical Problem

However, the Mn—Zn ferrite particles disclosed in Patent Literature 1 have a sphericity in a range of 0.95 to 1 and are truly spherical. Truly spherical particles have a large strain of a crystal lattice since a particle surface is spheroidized forcibly. Therefore, various magnetic characteristics, particularly frequency dependence of magnetic permeability, may be affected, which is not preferable. In addition, although the soft magnetic metal complex disclosed in Patent Literature 2 is described as capable of maintaining the magnetic permeability as compared with the case of the soft magnetic metal powder alone, it is not preferable because the magnetic permeability strictly decreases. Therefore, desired are Mn—Zn ferrite particles which can improve the magnetic permeability when used together with a soft magnetic powder such as an iron powder, an iron alloy powder and a ferrite particle, as compared with the soft magnetic powder alone.

Therefore, an object of the present invention is to provide Mn—Zn ferrite particles which can improve the magnetic permeability when used together with a soft magnetic powder as compared with the soft magnetic powder alone. Another object of the present invention is to provide a resin molded body containing the Mn—Zn ferrite particles, a soft magnetic mixed powder, and a magnetic core.

SUMMARY OF INVENTION

Solution to Problem

Specifically, the object of the present invention is achieved by the following means.

[1]
Mn—Zn ferrite particles containing 44 to 60 mass % of Fe, 10 to 16 mass % of Mn, and 1 to 11 mass % of Zn, in which
the ferrite particles are single crystals having an average particle diameter of 1 to 2,000 nm and have a polyhedral particle shape with an average sphericity of 0.85 or more and less than 0.95.

[2]
The Mn—Zn ferrite particles according to [1], in which the ferrite particles have a saturation magnetization of 50 to 65 $Am^2/kg$.

[3]
The Mn—Zn ferrite particles according to [1] or [2], in which the ferrite particles have an average particle diameter of 5 to 1,500 nm.

[4]
A resin molded body containing the Mn—Zn ferrite particles as described in any one of [1] to [3].

[5]
A soft magnetic mixed powder containing the Mn—Zn ferrite particles as described in any one of [1] to [3] and a soft magnetic powder.

[6]
A magnetic core containing the soft magnetic mixed powder as described in [5].

Advantageous Effects of Invention

The Mn—Zn ferrite particles according to the present invention can provide a higher magnetic permeability when used together with a soft magnetic powder as compared with the soft magnetic powder alone.

DESCRIPTION OF EMBODIMENTS

Modes for carrying out the present invention will be described below.

<Mn-Zn Ferrite Particles According to Present Invention>

The Mn—Zn ferrite particles according to the present invention (hereinafter also referred to as "ferrite particles of the present invention") are Mn—Zn ferrite particles containing 44 to 60 mass % of Fe, 10 to 16 mass % of Mn, and 1 to 11 mass % of Zn, and the ferrite particles are single crystals having an average particle diameter of 1 to 2,000 nm and have a polyhedral particle shape with an average sphericity of 0.85 or more and less than 0.95. The Mn—Zn ferrite particles according to the present invention can provide a high saturation magnetic flux density, and when used together with a soft magnetic powder, can provide a higher magnetic permeability as compared with the soft magnetic powder alone.

(Composition)

The Mn—Zn ferrite particles according to the present invention contain 44 to 60 mass % of Fe, 10 to 16 mass % of Mn, and 1 to 11 mass % of Zn. Therefore, the Mn—Zn ferrite particles according to the present invention can provide a desired saturation magnetic flux density and a desired magnetic permeability.

In the case where the content of Fe in the ferrite particles of the present invention is less than 44 mass %, a desired magnetic permeability cannot be obtained, which is not preferable. On the other hand, in the case where the content of Fe exceeds 60 mass %, the composition is close to magnetite and residual magnetization becomes large and the ferrite particles become easy to agglomerate, which is not preferable.

The content of Fe in the ferrite particles of the present invention is preferably 45 mass % or more, and more preferably 45.5 mass % or more.

The content of Fe in the ferrite particles of the present invention is preferably 58 mass % or less, and more preferably 55 mass % or less.

In the case where the content of Mn in the ferrite particles of the present invention is less than 10 mass %, a desired magnetic permeability may not be obtained, which is not preferable. In addition, the residual magnetization increases, and the ferrite particles are easy to agglomerate together, which is not preferable. On the other hand, in the case where the content of Mn exceeds 16 mass %, a high saturation magnetic flux density may not be obtained, which is not preferable.

The content of Mn in the ferrite particles of the present invention is preferably 11 mass % or more, and more preferably 12 mass % or more.

The content of Mn in the ferrite particles of the present invention is preferably 15 mass % or less, and more preferably 14 mass % or less.

In the case where the content of Zn in the ferrite particles of the present invention is less than 1 mass %, a coercive force is too large, and a particle shape approaches a spherical shape instead of a polyhedral shape, which is not preferable. On the other hand, in the case where the content of Zn exceeds 11 mass %, a high saturation magnetic flux density cannot be obtained, which is not preferable.

The content of Zn in the ferrite particles of the present invention is preferably 2 mass % or more, and more preferably 3 mass % or more.

The content of Zn in the ferrite particles of the present invention is preferably 10 mass % or less, and more preferably 9 mass % or less.

(Average Particle Diameter)

The Mn—Zn ferrite particles according to the present invention have an average particle diameter of 1 to 2,000 nm, preferably 5 to 1,500 nm, and more preferably 10 to 300 nm. In the case where the average particle diameter is in this range, when the Mn—Zn ferrite particles are mixed with a soft magnetic powder to prepare a soft magnetic mixed powder and a magnetic core is formed by the soft magnetic mixed powder, the Mn—Zn ferrite particles can enter gaps between particles of the soft magnetic powder to provide excellent filling properties. In the case where the average particle diameter of the Mn—Zn ferrite particles is less than 1 nm, even though a surface treatment is performed on the Mn—Zn ferrite particles, the particles aggregate, which is not preferable. On the other hand, in the case where the average particle diameter of the Mn—Zn ferrite particles exceeds 2,000 nm, the Mn—Zn ferrite particles are difficult to enter the gaps between the particles of the soft magnetic powder to thereby deteriorate the filling properties, and it is difficult to obtain a single crystal, which are not preferable.

The average particle diameter of the ferrite particles can be determined as follows. First, the ferrite particles are imaged at a magnification of 100,000 to 200,000 by using a FE-SEM as a scanning electron microscope (SU-8020, Hitachi High-Technologies Corporation). At this time, a plurality of visual fields are imaged in a state in which 5 to 50 particles of the ferrite particles come within one visual field and shapes of the ferrite particles can be clearly viewed. The imaged SEM image is read into an image analysis software (Image-Pro PLUS, Media Cybernetics, Inc.), and image analysis is performed. Then, horizontal Feret particle diameters of at least 200 particles or more of the ferrite particles are measured by manual measurement from the image imaged at a magnification of 100,000 to 200,000, and the average value thereof is defined as the "average particle diameter".

(Crystal Form)

A form of the Mn—Zn ferrite particles according to the present invention is a single crystal. In the case of the ferrite particles of single crystals, magnetic domain walls generated by an alternating magnetic field do not pass through a grain boundary surface, and thus, excellent frequency characteristics can be achieved. In addition, even though the magnetic permeability has a maximum due to resonance of the magnetic domain walls, a substantially constant magnetic permeability can be obtained in a wide band from a low frequency side to a high frequency side. On the other hand, in the case of ferrite particles of polycrystals, a crystal grain boundary generates in a fine structure in one particle in the course of crystal growth by sintering. Then, when magnetic domain walls generated by an alternating magnetic field pass through a grain boundary surface, the magnetic domain walls are anchored at the crystal grain boundary to decrease frequency properties, which is not preferable.

The crystal form of the ferrite particles can be measured, for example, by observing presence or absence of the crystal grain boundary of the ferrite particles from a TEM image of the ferrite particles by using a transmission electron microscope HF-2100 Cold-FE-TEM (manufactured by Hitachi High-Technologies Corporation).

The crystal form of the ferrite particles can be observed, for example, by imaging a limited visual field electron diffraction image by using a transmission electron microscope HF-2100 Cold-FE-TEM (manufactured by Hitachi High-Technologies Corporation).

(Particle Shape)

The Mn—Zn ferrite particles according to the present invention have a polyhedral shape having an average sphericity of 0.85 or more and less than 0.95. The ferrite particles are in a polyhedral shape reflecting that they are single crystals. Therefore, the single crystal structure of the particles having an average sphericity of less than 0.85 may be broken due to segregation of the composition. On the other hand, particles having an average sphericity of 0.95 or more are spherical rather than polyhedral. The spherical particles have a large strain of a crystal lattice since a panicle surface is spheroidized forcibly. In this case, various magnetic characteristics may be affected, which is not preferable.

The Mn—Zn ferrite particles according to the present invention has an average sphericity of 0.85 or more and less than 0.95, and in this case, the shape is a polyhedral.

The polyhedral shape (polyhedral form) typically has 10 or more faces, preferably 10 or more faces and 100 or less faces, more preferably 12 or more faces and 72 or less faces, and still more preferably 14 or more faces and 24 or less faces.

The shape of the Mn—Zn ferrite particles according to the present invention can be observed by using, for example, a scanning electron microscope HD-2700 Cs-corrected STEM (manufactured by Hitachi High-Technologies Corporation).

(Average Sphericity)

The average sphericity of the ferrite particles is an average value of Wadell's working sphericities, and can be determined as follows. First, an image analysis is performed in the same manner as in the average particle diameter, and a diameter of a circle equal to a projection area of a particle and a diameter of the smallest circle circumscribed to the projection image of the particle are determined for at least 200 particles or more of the ferrite particles. The sphericity of each particle is calculated by the following formula (1), and the average value thereof is defined as "average sphericity".

$$\text{Sphericity} = \text{(diameter of circle equal to projection area of particle)} / \text{(diameter of smallest circle circumscribed to projection image of particle)} \quad (1)$$

(BET Specific Surface Area)

The Mn—Zn ferrite particles preferably have a BET specific surface area of 1 to 30 m$^2$/g. The BET specific surface area of less than 1 m$^2$/g means that the particles are large. In the case where the BET specific surface area is 1 or more, the gaps between the particles do not increase when the particles are mixed in a resin and used as a filler, and a filler filling rate can be increased, which is preferable. On the other hand, in the ferrite particles composed of Mn, Zn and Fe described in the present patent, since particles having a smooth surface state are often generated, the BET specific surface area of the Mn—Zn ferrite particles does not exceed 30 m$^2$/g in general.

The Mn—Zn ferrite particles according to the present invention can achieve predetermined magnetic characteristics because they have the above-described composition and particle form. These magnetic characteristics are measured in a state in which the Mn—Zn ferrite particles are filled in a cell or pressure molded, but not measured in a state of powder.

(Saturation Magnetic Flux Density)

The Mn—Zn ferrite particles according to the present invention can provide a saturation magnetic flux density of 4,000 to 5,000 Gauss. In the case where the saturation magnetic flux density is 4,000 Gauss or more, miniaturization of a magnetic core can be achieved when the ferrite particles are used as a constituent material of the magnetic core, which is preferable. Although the saturation magnetic flux density may exceed 5,000 Gauss, it is generally difficult to achieve a saturation magnetic flux density exceeding 5,000 Gauss in the Mn—Zn ferrite particles having the above-described composition and particle form.

Incidentally, 10,000 Gauss (G)=1 Tesla (T).

(Saturation Magnetization)

The Mn—Zn ferrite particles according to the present invention preferably have a saturation magnetization of 50 to 65 Am$^2$/kg. The "saturation magnetization" as referred to in the present description is the magnetization when the ferrite particles are filled in a predetermined cell and a magnetic field of 5 K·1000/4 π·A/m is applied with a magnetic measurement device. In the case where the saturation magnetization is 50 Am$^2$/kg or more, the saturation magnetic flux density of 4,000 to 5,000 Gauss is easily obtained, which is preferable. The saturation magnetization may exceed 65 Am$^2$/kg. However, in the Mn—Zn ferrite particles having the above-described composition and particle form, when the saturation magnetization exceeds 65 Am$^2$/kg, residual magnetization may easily increase, and the frequency characteristics of the magnetic permeability of the ferrite particles may deteriorate.

(Residual Magnetization)

The Mn—Zn ferrite particles according to the present invention preferably have a residual magnetization of less than 8 Am$^2$/kg. When the ferrite particles are filled in a predetermined cell, a magnetic field of 5 K·1000/4 π·A/m is applied with a magnetic measurement device, then the applied magnetic field is reduced and an M-H hysteresis loop is created on a recording paper, the "residual magnetization" as referred to in the present description is the magnetization at which the applied magnetic field is 0 K·1000/4 π·A/m in the loop. Since the residual magnetization of the ferrite particles is less than 8 Am$^2$/kg, aggregation of the particles can be prevented and excellent dispersibility can be obtained. In the case where the residual magnetization is 8 Am$^2$/kg or more, the particles aggregate and excellent dispersibility cannot be obtained, which is not preferable.

In addition, when the ferrite particles are mixed with a magnetic metal powder such as an iron powder, the ferrite particles cannot be uniformly mixed with the magnetic metal powder due to sticking to the magnetic metal powder, or the like, which is not preferable.

(Coercive Force)

The Mn—Zn ferrite particles according to the present invention preferably have a coercive force of 60 to 80 Oe. The coercive force as referred to in the present description is the magnitude of the magnetic field at which the magnetization becomes zero when an external magnetization is applied in an opposite direction from a state in which the residual magnetization is present in the above-mentioned M-H hysteresis loop. Since the coercive force of the ferrite particles is as low as 60 to 80 Oe, low loss can be achieved. In the Mn—Zn ferrite particles having an average particle diameter of 1 to 2,000 nm, the coercive force is generally not less than 60 Oe. In the case where the coercive force is 80 Oe or less, a desired magnetic permeability is easily obtained, which is preferable.

Incidentally, 1 A/m=4 $\pi/10^3$Oe.

(Magnetic Permeability)

A magnetic permeability p is generally expressed as a complex permeability $\mu=\mu'-j\mu''$ (j is an imaginary unit). The real part $\mu'$ of the complex magnetic permeability represents a general magnetic permeability component, and the imaginary part $\mu''$ represents loss. In the Mn—Zn ferrite particles according to the present invention, when a graph is created by putting the real part $\mu'$ of the complex permeability on a vertical axis, the real part $\mu'$ of the complex permeability shows a constant value on a low frequency side, but decreases linearly as the frequency increases. The real part $\mu'$ of the complex permeability shows a numerical value not less than a certain value exceeding 1 not only in a frequency band of 1 to 100 MHz but also in a frequency band of 100 MHz to 1 GHz. Incidentally, the real part $\mu'$ of the complex permeability of the Mn—Zn ferrite particles according to the present invention may have a maximum in some cases and may have no maximum in other cases. The maximum of the real part $\mu'$ is considered to be caused by ease of occurrence of resonance of magnetic domain walls.

(Amount of $Fe^{2+}$)

In the ferrite particles of the present invention, the amount of $Fe^{2+}$ is preferably 0.1 mass % or less. In the case where the amount of $Fe^{2+}$ is 0.1 mass % or less, a large amount of magnetite is not present on a surface of the ferrite particles, which is preferable. The magnetite acts in a direction in which electric resistance of the ferrite particles is reduced and the residual magnetization is increased.

In the ferrite particles, the amount of $Fe^{2+}$ can be measured by an oxidation-reduction titration with a potassium permanganate solution. The oxidation-reduction titration can be performed in accordance with JIS M 8213, and potassium permanganate can also be used instead of potassium dichromate.

(True Density)

True density of the ferrite particles of the present invention is preferably 4.9 g/cm$^3$ to 5.0 g/cm$^3$ in view of maximizing an ability of magnetic characteristics in the resin composition by increasing a high filling rate when the ferrite particles are mixed with a resin.

The true density can be measured by a gaseous displacement method in accordance with JIS Z 8807: 2012.

Although the ferrite particles of the present invention contain 44 to 60 mass % of Fe, 10 to 16 mass % of Mn and 1 to 11 mass % of Zn, other metal components may be contained. Examples of the other metal components include Li, Si, Ca, Ti, Al$_2$ and Cu.

The ferrite particles of the present invention may contain components other than Fe, Mn and Zn as the metal components, but preferably only contains Fe, Mn and Zn as the metal components.

<Method for Producing Mn—Zn Ferrite Particles>

The Mn—Zn ferrite particles can be obtained, for example, as follows. First, a granulated substance made of a ferrite raw material is subjected to a preliminary sintering, and then thermally sprayed in the atmosphere to melt the preliminarily sintered powder to form ferrite. The obtained ferrite particles are rapidly cooled and solidified, and then only the ferrite particles having a particle diameter of not more than a predetermined range are recovered. Hereinafter, a method for producing the Mn—Zn ferrite particles will be described in detail.

A method for preparing the ferrite raw material is not particularly limited, and a conventionally and commonly known method can be adopted. A dry method may be used, and a wet method may be used.

As an example of the method for preparing the ferrite raw material (granulated substance), a Zn raw material, a Mn raw material and a Fe raw material are weighed to be a desired ferrite composition, and water is added thereto, followed by pulverization, to prepare a slurry. The prepared slurry is granulated by a spray drier and classified to prepare a granulated substance having a predetermined particle diameter. The particle diameter of the granulated substance is preferably about 5 to 30 μm in consideration of the particle diameter of the ferrite particles to be obtained. In addition, as another example, a ferrite raw material having a prepared constitution is mixed and subjected to a dry grinding to pulverizing and dispersing each raw material, and the mixture is granulated with a granulator and classified to prepare the granulated substance having a predetermined particle diameter.

Subsequently, the granulated substance thus prepared is preliminarily sintered in the atmosphere. The preliminary sintering is performed by holding the granulated substance at a temperature of 850 to 1,250° C. for 2 to 6 hours, and then pulverization is performed. Thus, a preliminarily sintered powder having an average particle diameter of 3.5 to 28 μm is obtained.

Next, the obtained preliminarily sintered powder is subjected to a sintering to form ferrite. The sintering is performed by a thermal spraying in the atmosphere. The thermal spraying temperature is preferably 1,000 to 3,500° C., and more preferably 2,000 to 3,500° C.

In the thermal spraying, a mixed gas of a combustion gas and oxygen gas can be used as combustible gas combustion flame, and the volume ratio of the combustion gas to the oxygen gas is 1:3.5 to 6.0. In the case where the ratio of the oxygen gas in the combustible gas combustion flame to the combustion gas is less than 3.5, melting may be insufficient. In the case where the ratio of the oxygen gas to the combustion gas exceeds 6.0, ferrite formation becomes difficult. For example, the oxygen gas can be used at a ratio of 35 to 60 Nm$^3$/hr to 10 Nm$^3$/hr of the combustion gas.

As the combustion gas used for the thermal spraying, propane gas, propylene gas, acetylene gas, or the like can be used, particularly propane gas can be used suitably. In addition, nitrogen gas, oxygen gas or air can be used as a granulated substance-transporting gas for transporting the granulated substance into combustion of the combustible gas. The flow rate of the granulated substance to be transported is preferably 20 to 60 m/sec.

In the thermal spraying, the preliminarily sintered powder is melted to form ferrite, and a part of the ferrite component is vaporized. More specifically, since the temperature of the gas flame is higher than the boiling points of any of Fe, Mn and Zn, which are elements constituting the preliminarily sintered powder, when the preliminarily sintered powder passes through the high-temperature gas flame, these elements are vaporized on a surface of the preliminarily sintered powder. Then, in a process in which the particles passing through the gas flame are cooled, these elements are precipitated, thereby generating single crystal particles. However, the preliminarily sintered powder is not entirely vaporized, and unvaporized preliminarily sintered powder melts when passing through the gas flame, is spheroidized by surface tension, and is cooled after passing through the gas flame. Therefore, the ferrite particles generated from the unvaporized preliminarily sintered powder have a particle diameter close to that of the preliminarily sintered powder, whereas the ferrite particles generated from the component vaporized from the preliminarily sintered powder have a particle diameter much smaller than that of the preliminarily sintered powder.

Subsequently, the ferrite particles generated by the thermal spraying are transported in the atmosphere on an airflow by supplied air, and thus the ferrite particles having an average particle diameter of 1 to 2,000 nm are collected and recovered.

The collection can be performed by a method in which the ferrite particles which are rapidly cooled, solidified and precipitated are transported on an airflow by supplied air, and by utilizing the fact that particles having a large particle diameter fall in the course of airflow transportation while the other particles are transported by airflow to an downstream side, ferrite particles having an average particle diameter in the above-mentioned range is collected by a filter provided on the downstream side of the airflow.

In the case where the flow rate during the airflow transportation is set to 20 to 60 m/sec, the ferrite particles having a large particle diameter can be made to drop in the course of the airflow transportation, and only the ferrite particles having an average particle diameter in the above range can be efficiently recovered in the downstream of the airflow. In the case where the flow rate is less than 20 m/sec, since even ferrite particles having a small particle diameter drop in the course of the airflow transportation, the average particle diameter of the ferrite particles recovered in the downstream of the airflow is less than 1 nm, or productivity is reduced due to reduction of an absolute amount of the ferrite particles collected in the downstream of the airflow, which is not preferable. On the other hand, in the case where the flow rate exceeds 60 m/sec, since even the ferrite particles having a large particle diameter are transported by air to the downstream, the average particle diameter of the ferrite particles collected in the downstream of the airflow may exceed 2,000 nm, which is not preferable.

Thereafter, the collected ferrite particles are classified as necessary to adjust the particle diameter to a desired particle diameter. A conventionally known air classification, mesh filtration method, sedimentation method, or the like can be used as a classification method. For example, the ferrite particles having a particle diameter exceeding 2,000 nm may be removed by the classification. From the above, the Mn—Zn ferrite particles having an average particle diameter of 1 to 2,000 nm can be obtained.

The obtained Mn—Zn ferrite particles are preferably subjected to a surface treatment with a coupling agent. Dispersibility of the ferrite particles into a resin can be further improved by performing the surface treatment with a coupling agent. As the coupling agent, various silane-coupling agents, titanate-coupling agents and aluminate-coupling agents can be used, and decyl trimethoxysilane, decyltriethoxysilane and n-octyltriethoxysilane can be more preferably used. The surface treatment amount depends also on the BET specific surface area of the ferrite particles, but is preferably 0.05 to 2 mass % with respect to the ferrite particles in terms of the silane-coupling agents.

<Application of Mn—Zn Ferrite Particles>

Since the Mn—Zn ferrite particles according to the present invention have the above-described magnetic characteristics, they are suitable for a magnetic core (core and yoke), an inductor, or the like. In this case, the magnetic core or the like may be formed of the Mn—Zn ferrite particles alone, the magnetic core or the like may be formed of a resin molded body containing the Mn—Zn ferrite particles and a resin, and the magnetic core or the like may be formed of a soft magnetic mixed powder containing the Mn—Zn ferrite particles and a soft magnetic powder. The present invention also relates to the magnetic core containing the soft magnetic mixed powder.

According to the soft magnetic mixed powder containing the Mn—Zn ferrite particles according to the present invention and a soft magnetic powder, magnetic permeability can be made higher and electric resistance can be made higher as compared with the soft magnetic powder alone. The magnetic permeability of the soft magnetic mixed powder can achieve a higher value than the arithmetically calculated value of the magnetic permeability in consideration of the weight-mixing ratio of the Mn—Zn ferrite particles to the soft magnetic powder.

The resin used together with the Mn—Zn ferrite particles when constituting the resin molded body is not particularly limited as long as it does not impair the effects of the present invention. For example, an epoxy resin, a urethane resin, a silicone resin, a PPS resin, and an LCP resin can be used.

The content of the Mn—Zn ferrite particles of the present invention in the resin molded body is preferably 10 to 98 mass %, more preferably 30 to 98 mass %, and still more preferably 45 to 98 mass % with respect to a total amount of the resin molded body.

The soft magnetic powder used together with the Mn—Zn ferrite particles when constituting the soft magnetic mixed powder is not particularly limited as long as it does not impair the effects of the present invention. For example, an iron powder and an iron alloy powder which are metal magnetic bodies, or ferrite particles which are oxide magnetic bodies can be used. As the iron powder and the iron alloy powder, various iron powders or iron alloy powders such as a carbonyl iron powder, a Fe—Si alloy powder, a Fe—Si—Al alloy powder, a Fe—Si—Cr alloy powder, and a Fe—Ni alloy powder can be used. The carbonyl iron powder is a powder generated by heating and reacting reduced iron, which is obtained by reducing ferric oxide, and carbon monoxide under pressure. As the ferrite particles, Ni—Zn ferrite, Ni—Zn—Cu ferrite, Mg—Zn ferrite, Mn—Mg ferrite, Mn—Zn ferrite (other than the Mn—Zn ferrite particles of the present invention), and the like can be used.

As these soft magnetic powders, for example, use can be suitably made of those having an average particle diameter of 2 to 20 μm. In the case where the average particle diameter of the soft magnetic powder is less than 2 μm, since the particle diameter is in a similar level to the particle diameter of the ferrite particles according to the present invention, the Mn—Zn ferrite particles is difficult to enter gaps between the particles of the soft magnetic powder. Therefore, the gaps remain between the particles of the soft magnetic powder, and an effect of a demagnetizing field increases. Accordingly, the effect of improving the magnetic permeability cannot be expected. On the other hand, in the case where the average particle diameter of the soft magnetic powder exceeds 20 μm, the gaps between the particles of the soft magnetic powder are large. Accordingly, it is necessary to add a large amount of ferrite particles in order to fill the gaps with the ferrite particles.

The mixing ratio of the Mn—Zn ferrite particles to the soft magnetic powder in the soft magnetic mixed powder is preferably 5 to 50:95 to 50 (Mn—Zn ferrite particles:soft magnetic powder (mass ratio) is 5 to 50:95 to 50), more preferably from 7.5 to 50:92.5 to 50, and still more preferably 10 to 30:90 to 70.

The content of the Mn—Zn ferrite particles in the soft magnetic mixed powder is preferably 5 to 50 mass %, more preferably 7.5 to 50 mass %, and still more preferably 10 to 30 mass % with respect to the total content of the Mn—Zn ferrite particles and the soft magnetic powder.

In the case where the content of the Mn—Zn ferrite particles is 5 mass % or more, the effect of increasing the electric resistance is not lowered, which is preferable. On the other hand, in the case where the content of the Mn—Zn ferrite particles is 50 mass % or less, the magnetic permeability is easy to increase, which is preferable.

EXAMPLES

Hereinafter, the present invention will be described in detail based on Examples.

1. Production of Ferrite Particles

Example 1

Iron oxide ($Fe_2O_3$), manganese oxide (MnO) and zinc oxide (ZnO) were weighed at a molar ratio of 59:30:11 and mixed. Water was added to the obtained raw material mixture, followed by pulverization, to prepare a slurry having a solid content of 50 mass %. The prepared slurry was granulated by a spray drier, subjected to a preliminary sintering, and classified by an airflow classifier to prepare a granulated substance having an average particle diameter of 25 μm.

Subsequently, the obtained granulated substance was held in the atmosphere at 1,100° C. for 4 hours, and then pulverized by a hammer mill to obtain a preliminarily sintered powder having an average particle diameter of 20 μm.

Next, the obtained preliminarily sintered powder was subjected to a thermal spraying in a combustible gas combustion flame of propane:oxygen gas=10 $Nm^3$/hr:35 $Nm^3$/hr under a condition of a flow rate of about 40 m/sec, to form ferrite. The thermal spraying temperature (sintering temperature) was 2,000° C. Subsequently, the ferrite particles were rapidly cooled in the atmosphere by being transported on the airflow by supplied air. The thermal spraying and rapid cooling were performed while the granulated product was made flow continuously, and thus the obtained particles were independent without binding to each other. Subsequently, the cooled particles were collected by a bug filter provided on the downstream side of the airflow. At this time, particles having a large particle diameter dropped in the course of the airflow, and thus were not collected by the bug filter. Next, from the collected (recovered) particles, coarse particles having a particle diameter exceeding 2,000 nm were removed by classification to obtain the ferrite particles. Therefore, a particle diameter of a particle having the largest particle diameter among the obtained ferrite particles was 2,000 nm or less. Table 1 shows production conditions of the granulated substance and chemical analysis results of the preliminarily sintered powder. The chemical analysis of the preliminarily sintered powder was performed in the same manner as in the chemical analysis of the ferrite particles by an ICP analyzer to be described later.

Example 2

In this Example, ferrite particles were prepared in the same manner as in Example 1 except that a raw material mixture was prepared at a molar ratio among the iron oxide, manganese oxide and zinc oxide being 52.5:36.6:10.9.

Comparative Example 1

In this Comparative Example, ferrite particles were prepared in the same manner as in Example 1 except that a raw material mixture was prepared at a molar ratio among the iron oxide, manganese oxide and zinc oxide being 50:35.5:14.5.

Comparative Example 2

In this Comparative Example, ferrite particles were prepared in the same manner as in Example 1 except that a raw material mixture was prepared at a molar ratio of the iron oxide and manganese oxide being 80:20 without adding zinc oxide.

Comparative Example 3

In this Comparative Example, ferrite particles were prepared in the same manner as in Example 1 except that a raw material mixture was prepared by using iron oxide only without adding manganese oxide and zinc oxide.

2. Evaluation of Ferrite Particles

Chemical analysis was performed on the obtained ferrite particles of Examples 1 and 2 and Comparative Examples 1 to 3, and average particle diameter, particle shape, average sphericity, crystal form, presence or absence of a spinel phase, amount of $Fe^{2+}$, BET specific surface area, true density, and magnetic characteristics (saturation magnetization, residual magnetization, coercive force, and saturation magnetic flux density) were measured. Respective measurement methods are as follows. The results are shown in Table 2.

(Chemical Analysis)

The contents of the metal components in the ferrite particles were measured as follows. First, 0.2 g of the ferrite particles were weighed, thereto was added a mixture prepared by adding 20 mL of 1 N hydrochloric acid and 20 mL of 1 N nitric acid to 60 mL of pure water, followed by heating, so as to prepare an aqueous solution in which the ferrite particles were completely dissolved. The obtained aqueous solution was set in an ICP analyzer (ICPS-1000IV, Shimadzu Corporation), and the contents of the metal components in the ferrite particles were measured.

The composition ratio (chemical analysis result) of the ferrite particles does not match the composition ratio (calculation value) in the raw material mixture. It is considered that the reason thereof is that vaporization rates and precipitation rates of elements in a process of thermally spraying the preliminarily sintered particles to generate the ferrite particles are different since saturated vapor pressures of the elements of Fe, Mn and Zn are different from each other.

(Average Particle Diameter)

A horizontal Feret diameter measured by the method described above was set as the average particle diameter.

(Particle Shape)

Figure 1:
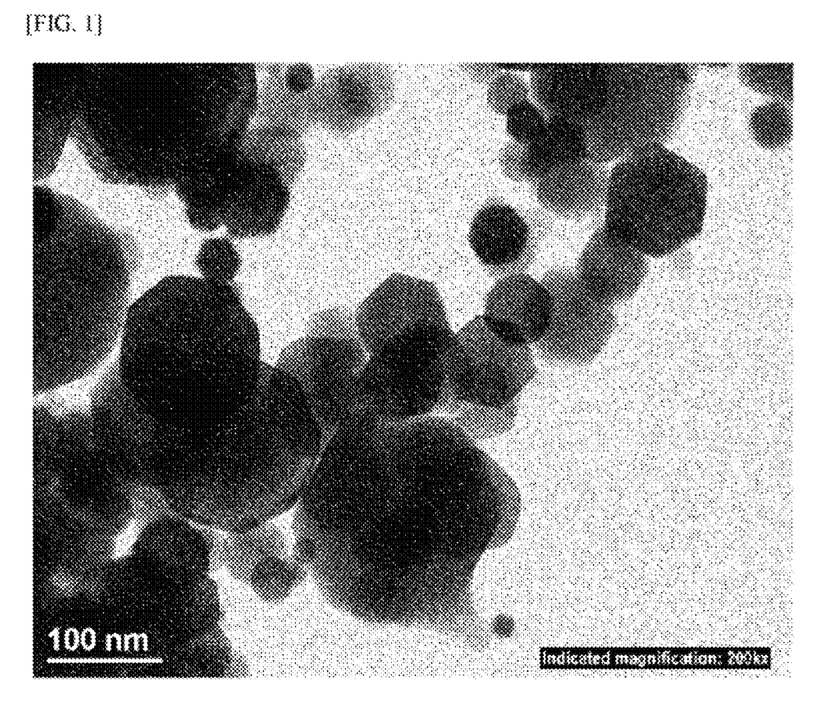
FIG. 1 is an image of a secondary electron image by STEM observation of ferrite particles of Example 1.

The particle shape of the ferrite particles was observed by using a scanning transmission electron microscope HD-2700 Cs-corrected STEM (manufactured by Hitachi High-Technologies Corporation). The acceleration voltage was set to 200 kV. FIG. 1 shows an image of a secondary electron image (magnification of 200,000) by STEM observation of the ferrite particles of Example 1.

(Average Sphericity)

Sphericities of 100 particles of the ferrite particles were measured by the method described above, and an average value (average sphericity) thereof was calculated.

(Crystal Form)

Figure 2A:
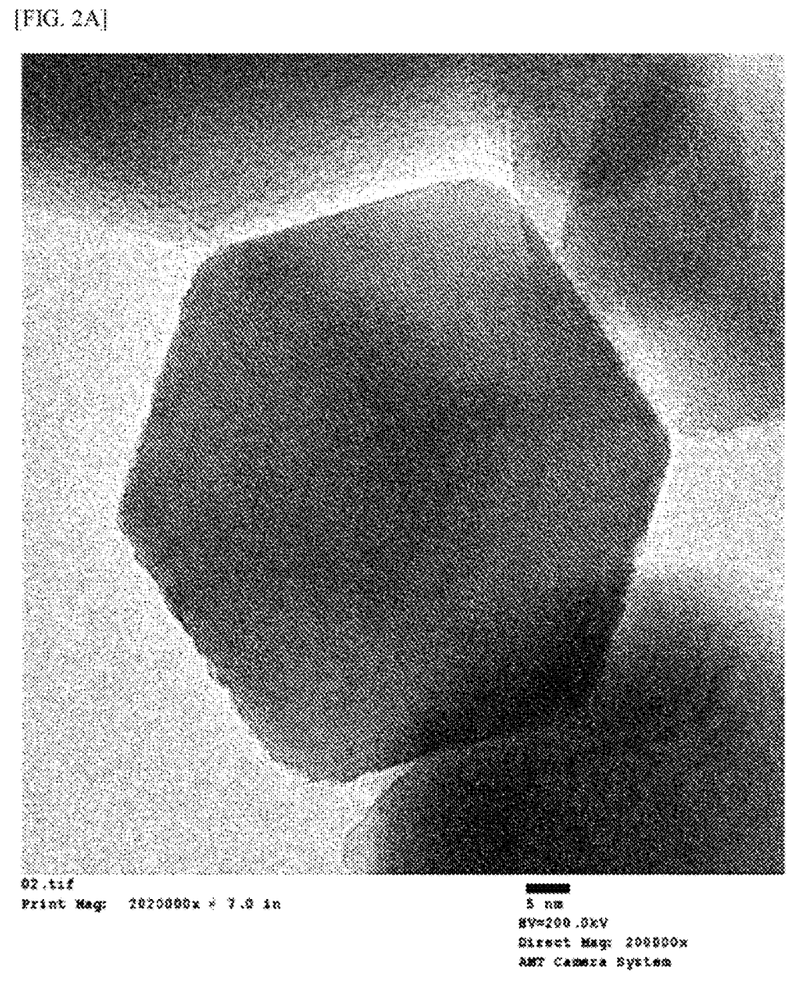
FIG. 2A is an image of a TEM image (magnification of 200,000) of the ferrite particles of Example 1.
Figure 2B:
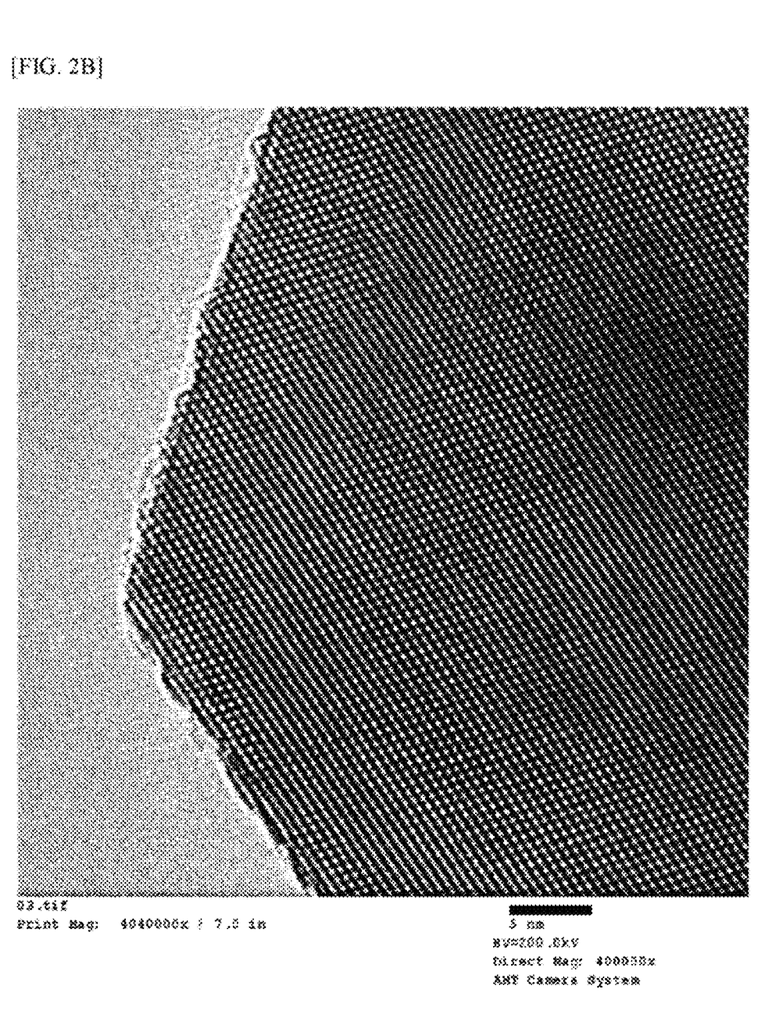
FIG. 2B is an image of a TEM image (magnification of 400,000) of the ferrite particles of Example 1.

In order to evaluate the crystal form of the ferrite particles, the ferrite particles were observed by using a transmission electron microscope HF-2100 Cold-FE-TEM (manufactured by Hitachi High-Technologies Corporation). The acceleration voltage was set to 200 kV. FIG. 2A and FIG. 2B show images of TEM images of the ferrite particles of Example 1. FIG. 2A has a magnification of 200,000, and FIG. 2B has a magnification of 400,000.

Figure 3:
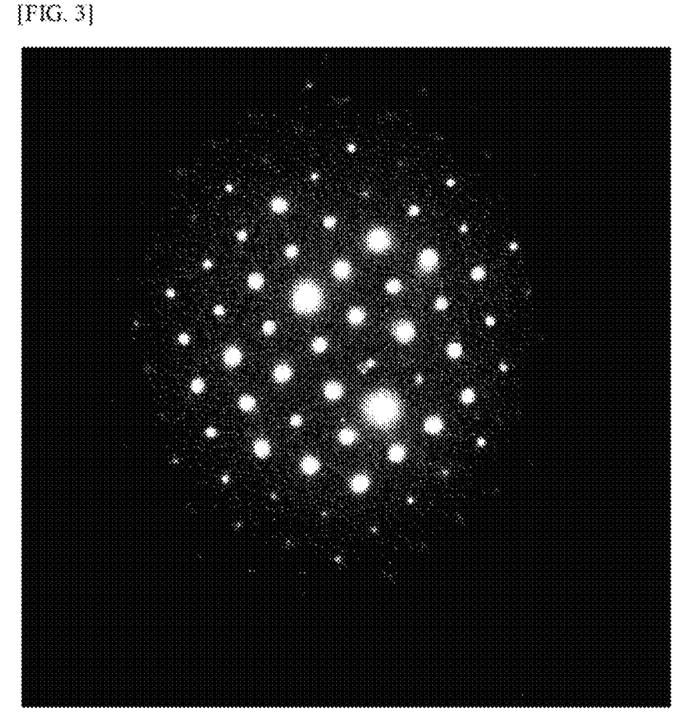
FIG. 3 is an image by electron beam diffraction of the ferrite particles of Example 1.

Furthermore, a limited visual field electron diffraction image was imaged by using the transmission electron microscope HF-2100 Cold-FE-TEM (manufactured by Hitachi High-Technologies Corporation). FIG. 3 shows an electron diffraction image of the ferrite particles of Example 1.

(Spinel Phase)

"X'Pert PRO MPD" manufactured by PANalytical was used as a measurement device. A Co bulb (CoKα ray) was used as an X-ray source and the measurement was performed by a concentrated optical system in a continuous scan of 0.2°/sec. "X'Celarator" was used as a high-speed detector. The measurement results were analyzed by using an analysis software "X'Pert HighScore" in the same manner as in a usual crystal structure analysis of a powder. The case where the presence of the spinel phase was confirmed in the analysis results was determined as "present", and the case where the presence was not confirmed was determined as "absent". When the presence of the spinel phase is confirmed, it means that the particles (powder) are soft ferrite.

(Amount of $Fe^{2+}$)

Presence or absence of $Fe^{2+}$ in the Mn—Zn ferrite particles was evaluated by an oxidation-reduction titration with a potassium permanganate solution. The oxidation-reduction titration was performed in accordance with JIS M 8213, and potassium permanganate was used instead of potassium dichromate.

The case where the amount of $Fe^{2+}$ was 0.1 mass % or less was determined as "absent", and the case where the amount of $Fe^2$ exceeded 0.1 mass % was determined as "present". When $Fe^{2+}$ is "present", it means that a large amount of magnetite is present on the surface of the ferrite particles. The magnetite acts in a direction in which electric resistance of the ferrite particles is reduced and the residual magnetization is increased. Therefore, the amount of $Fe^{2+}$ is preferably "absent".

(BET Specific Surface Area)

The measurement of the BET specific surface area was performed by using a specific surface area measurement device (Macsorb HM model-1208, Mountech Co. Ltd.). First, about 10 g of the obtained ferrite particles were placed on a weighing paper and degassed by a vacuum dryer, the vacuum degree was confirmed to be −0.1 MPa or lower and then, the ferrite powder was heated at 200° C. for two hours to remove water adhering to the surface of the ferrite particles. Subsequently, about 0.5 g to 4 g of the ferrite particles, from which water had been removed, was placed in a standard sample cell dedicated to the measurement device, and was accurately weighed by a precision balance. Subsequently, the weighed ferrite particles were set in the measurement port of this device and were measured. The measurement was performed by a one-point method. The measurement atmosphere was a temperature of 10 to 30° C. and a relative humidity of 20 to 80% (no condensation).

(True Density)

The measurement of the true density was performed by using a pycnometer in accordance with JIS Z 8807: 2012. Methanol was used as a solvent, and the measurement was performed at a temperature of 25° C.

(Magnetic Characteristics)

The measurements of the magnetic characteristics (saturation magnetization, residual magnetization, coercive force, and saturation magnetic flux density) were performed by using a vibration sample type magnetic measurement apparatus (VSM-C7-10A, Toei Industry Co., Ltd.). First, the obtained ferrite particles were filled in a cell having an inner diameter of 5 mm and a height of 2 mm and set in the apparatus. In the apparatus described above, a magnetic field was applied and swept to 5 K·1000/4 π·A/m. Next, the applied magnetic field was reduced, and an M-H hysteresis loop representing a relationship between the magnetization M and the magnetic field H was created on a recording paper. In the loop, the magnetization at which the applied magnetic field was 5 K·1000/4 π·A/m was set as the saturation magnetization, magnetization at which the applied magnetic field was 0 K·1000/4 π·A/m was set as the residual magnetization, and the magnitude of the magnetic field at which the magnetization became zero by applying external magnetization in an opposite direction from a state in which the residual magnetization was present was set as the coercive force. The magnetic flux density at which the applied magnetic field was 5 K·1000/4 π·A/m was set as the saturation magnetic flux density.

(Magnetic Permeability of Ferrite Particles)

Figure 4:
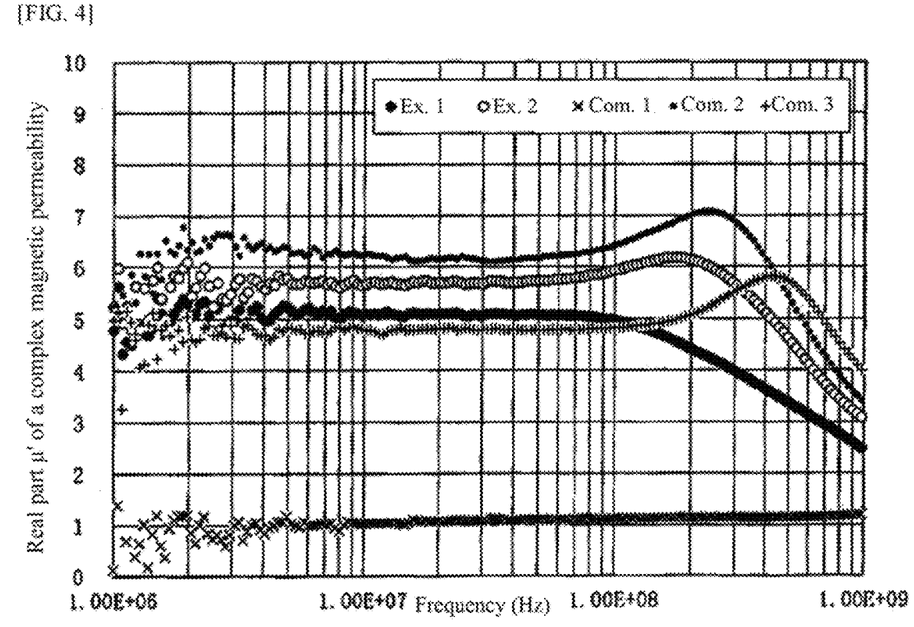
FIG. 4 is a graph showing frequency dependence of a real part μ' of a complex magnetic permeability of ferrite particles of Examples 1 and 2 and Comparative Examples 1 to 3.

The magnetic permeabilities of the ferrite particles of Examples 1 and 2 and Comparative Examples 1 to 3 were measured as follows. The measurement of the magnetic permeability was performed by using an E4991 A type RF impedance/material analyzer 16454A magnetic material measurement electrode, manufactured by Agilent Technologies. First, 4.5 g of the ferrite particles of Examples 1 and 2 and Comparative Examples 1 to 3 and 0.5 g of a fluorine powder resin (KYNAR (registered trademark) 301F, average particle diameter: 0.5 µm) were housed in a 100 cc-polyethylene container and stirred with a ball mill at 100 rpm over 30 minutes for mixing. After the completion of the stirring, about 0.8 g of the obtained mixture was filled in a die having an inner diameter of 4.5 mm and an outer diameter of 13 mm, and pressurized with a press machine at a pressure of 40 MPa for 1 minute. The obtained molded body was heated and hardened by a hot air drier at a temperature of 140*C for 2 hours to obtain a measurement sample. Then, the measurement sample was set in a measurement apparatus, and the outer diameter, inner diameter and height of the measurement sample measured in advance were input to the measurement apparatus. In the measurement, amplitude was set to 100 mV, a range of frequency of 1 MHz to 3 GHz was swept in a logarithmic scale, and the magnetic permeability (real part µ' of complex permeability) was measured. However, since an influence of a measurement jig is large in a frequency band exceeding frequency of 2 GHz, the measurement result was obtained but is not reliable, which is thus not considered. An obtained graph is shown in FIG. 4.

Next, volume resistance and magnetic permeability of the soft magnetic mixed powder of Examples 3 and 4 in which the Mn—Zn ferrite particles of Examples 1 and 2 were mixed with a soft magnetic powder were evaluated. The results are shown in Table 3 and FIGS. 5 to 6.

(Volume Resistance)

The measurement of the volume resistance was performed as follows. First, the Mn—Zn ferrite particles of Examples 1 and 2 and a soft magnetic powder were housed in a 100 cc-polyethylene container and mixed by stirring for 30 minutes with a ball mill at 100 rpm, to prepare the soft magnetic mixed powder of Examples 3 and 4. As the soft magnetic powder, an iron powder (carbonyl iron powder) having an average particle diameter of 3.5 μm was used.

The soft magnetic mixed powder of Example 3 was prepared by mixing the ferrite particles of Example 1 and the iron powder at a mass ratio of 10:90, and the soft magnetic mixed powder of Example 4 used the ferrite particles of Example 2 instead of the ferrite particles of Example 1. In addition, the soft magnetic mixed powders of Comparative Examples 4 to 6 were prepared. The soft magnetic mixed powder of Comparative Example 4 used only the iron powder without using the ferrite particles at all, the soft magnetic mixed powder of Comparative Example 5 used $TiO_2$ particles having an average particle diameter of 200 nm instead of the ferrite particles of Example 1, and the soft magnetic mixed powder of Comparative Example 6 used $SiO_2$ particles having an average particle diameter of 12 nm (primary particle diameter).

Figure 5:
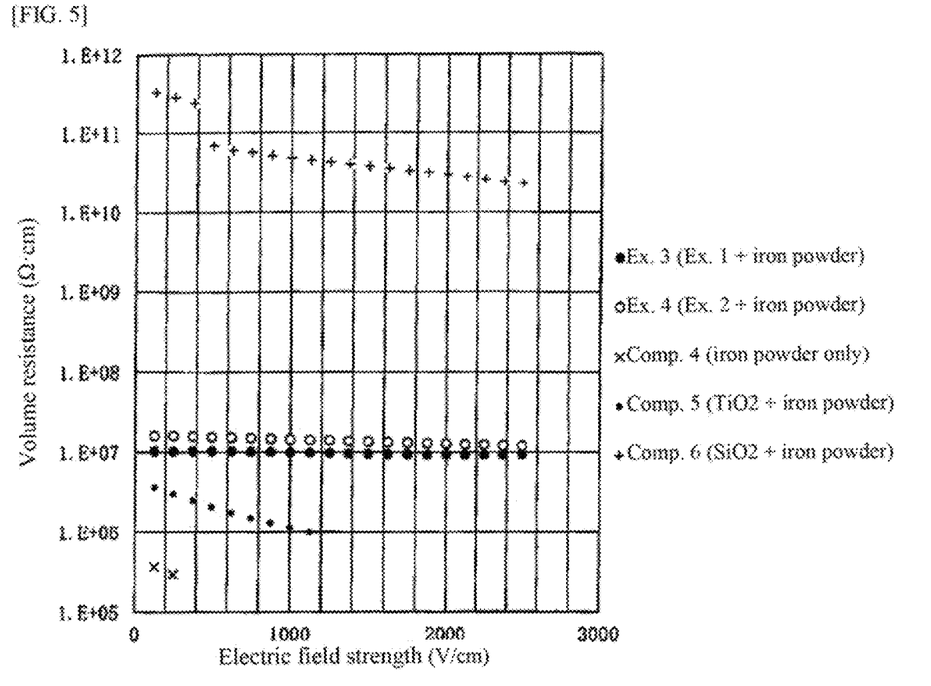
FIG. 5 is a graph showing electric field strength dependence of volume resistance of soft magnetic mixed powders of Examples 3 and 4 and Comparative Examples 4 to 6.

Next, the measurement sample was prepared by filling the obtained soft magnetic mixed powder of Examples 3 and 4 and Comparative Examples 4 to 6 in a cylinder made of a fluororesin having a cross-sectional area of 1.77 $cm^2$ so as to have a height of 4 mm in a state in which 1 kg of weight was placed thereon. Electrodes were attached to both ends of the measurement sample, then a measurement voltage was applied to the electrodes in a range of 0 to 1,000 V by using a 6517A type insulation resistance measuring instrument manufactured by Keithley Company, and a current value at the time of 10 seconds after the application was measured. The volume resistance was calculated from the cross-sectional area of the jig, the height of the measurement sample, the applied voltage, and the current value. The results are shown in FIG. 5 and Table 3. Since the electric resistance of the soft magnetic mixed powder of Comparative Examples 4 and 5 was excessively low, the volume resistance could not be calculated.

(Magnetic Permeability)

Figure 6:
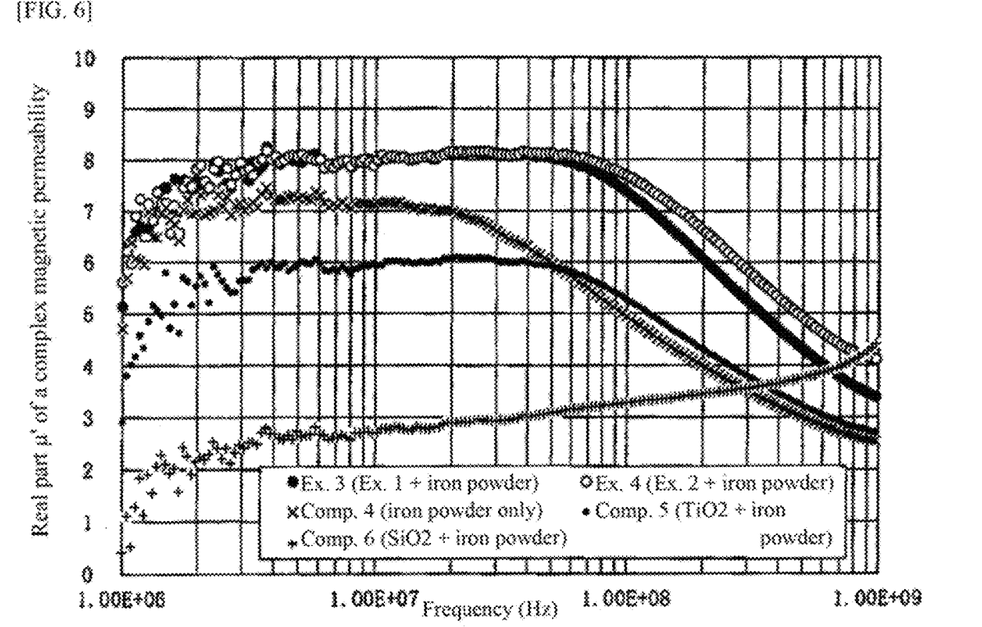
FIG. 6 is a graph showing frequency dependence of a real part μ' of a complex magnetic permeability of the soft magnetic mixed powders of Examples 3 and 4 and Comparative Examples 4 to 6.

Here, the magnetic permeability of the soft magnetic mixed powder was measured in the same manner as in the method for measuring the magnetic permeability of the ferrite particles, except that 4.5 g of the soft magnetic mixed powder of Examples 3 and 4 and Comparative Examples 4 to 6 was used instead of 4.5 g of the ferrite particles. Furthermore, an arithmetic calculation value of the magnetic permeability of the soft magnetic mixed powders of Examples 3 and 4 and Comparative Examples 4 to 6 at 10 MHz was calculated on the basis of actual measured values of the magnetic permeabilities (real part $\mu'$ of complex permeability) of the ferrite particles of Examples 1 and 2, iron powder, $TiO_2$ particles, and $SiO_2$ particles at frequency of 10 MHz. The results are shown in FIG. 6 and Table 3.

TABLE 1

| | Preparation mol ratio | | | Granulation device | Conditions of preliminary sintering | | Chemical analysis of preliminarily sintered powder (ICP) (mass %) | | |
|---|---|---|---|---|---|---|---|---|---|
| | $Fe_2O_3$ | MnO | ZnO | | Sintering atmosphere | Sintering temperature | Fe | Mn | Zn |
| Ex. 1 | 59 | 30 | 11 | Spray drier | Atmosphere | 1,100° C. | 52.63 | 13.34 | 5.73 |
| Ex. 2 | 52.5 | 36.6 | 10.9 | Spray drier | Atmosphere | 1,100° C. | 48.20 | 16.91 | 5.52 |
| Comp. Ex. 1 | 50 | 35.5 | 14.5 | Spray drier | Atmosphere | 1,100° C. | 46.78 | 16.22 | 8.93 |
| Comp. Ex. 2 | 80 | 20 | 0 | Spray drier | Atmosphere | 1,100° C. | 63.41 | 7.28 | 0.00 |
| Comp. Ex. 3 | 100 | 0 | 0 | Spray drier | Atmosphere | 1,100° C. | 70.74 | 0.60 | 0.00 |

TABLE 2

| | Chemical analysis (ICP (mass %)) | | | Presence or absence of $Fe^{2+}$ amount (*1) | Presence or absence of spinel phase (*2) | Average particle diameter (nm) | Particle shape | Average sphericity | Crystal form |
|---|---|---|---|---|---|---|---|---|---|
| | Fe | Mn | Zn | | | | | | |
| Ex. 1 | 50.06 | 12.58 | 8.07 | Absence | Presence | 169 | Polyhedral | 0.92 | Single crystal |
| Ex. 2 | 45.85 | 15.94 | 7.77 | Absence | Presence | 220 | Polyhedral | 0.89 | Single crystal |
| Comp. Ex. 1 | 43.17 | 15.24 | 12.53 | Absence | Presence | 181 | Polyhedral | 0.91 | Single crystal |
| Comp. Ex. 2 | 60.35 | 7.86 | 0.00 | Presence | Presence | 186 | Truly spherical | 0.96 | Single crystal |
| Comp. Ex. 3 | 68.35 | 0.44 | 0.00 | Presence | Presence | 169 | Truly spherical | 0.97 | Single crystal |

| | Magnetic characteristics (VSM @ 5 k Oe) | | | | BET specific surface area ($m^2/g$) | True density ($g/cm^3$) |
|---|---|---|---|---|---|---|
| | Saturation magnetization ($Am^2/kg$) | Residual magnetization ($Am^2/kg$) | Coercive force (Oe) | Saturation magnetic flux density (Gauss) | | |
| Ex. 1 | 50.85 | 5.48 | 75.36 | 4049 | 10.10 | 4.93 |
| Ex. 2 | 62.38 | 7.19 | 71.83 | 4967 | 14.20 | 4.91 |

TABLE 2-continued

|  | | | | | | |
|---|---|---|---|---|---|---|
| Comp. Ex. 1 | 41.52 | 3.55 | 56.35 | 3306 | 11.41 | 5.02 |
| Comp. Ex. 2 | 75.21 | 11.76 | 102.60 | 5988 | 10.37 | 4.87 |
| Comp. Ex. 3 | 66.19 | 11.12 | 105.40 | 5270 | 15.05 | 4.76 |

(*1): Measured by oxidation-reduction titration with a potassium permanganate solution.
(*2): Measured by XRD (X-Ray Diffraction).

TABLE 3

|  |  | Magnetic permeability @ 10 MHz (actual measured value) | Mixing ratio (mass %) | Magnetic permeability @ 10 MHz (actual measured value) | Magnetic permeability @ 10 MHz (arithmetic calculation value) | Actual measured value/Arithmetic calculation value | Volume resistance ($\Omega \cdot$ cm) @ 2500 V/cm |
|---|---|---|---|---|---|---|---|
| Soft magnetic mixed powder of Ex. 3 | Ferrite particles of Ex. 1 | 5.09 | 10 | 7.97 | 6.96 | 1.14 | 9.31E+06 |
|  | Carbonyl iron powder | 7.17 | 90 |  |  |  |  |
| Soft magnetic mixed powder of Ex. 4 | Ferrite particles of Ex. 2 | 5.67 | 10 | 7.99 | 7.02 | 1.14 | 1.20E+07 |
|  | Carbonyl iron powder | 7.17 | 90 |  |  |  |  |
| Soft magnetic mixed powder of Comp. Ex. 4 | Carbonyl iron powder | 7.17 | 100 | 7.17 | 7.17 | — | Cannot be measured |
| Soft magnetic mixed powder of Comp. Ex. 5 | $TiO_2$ particles | 0.00 | 10 | 5.94 | 6.46 | 0.92 | Cannot be measured |
|  | Carbonyl iron powder | 7.17 | 90 |  |  |  |  |
| Soft magnetic mixed powder of Comp. Ex. 6 | $SiO_2$ particles | 0.00 | 10 | 2.71 | 6.46 | 0.42 | 2.31E+10 |
|  | Carbonyl iron powder | 7.17 | 90 |  |  |  |  |

3. Evaluation Results of Ferrite Particles

It is known from FIG. 1 and FIG. 2A that the ferrite particles of Example 1 have a polyhedral particle shape. It is known from FIG. 2B that the ferrite particles of Example 1 are single crystals since no crystal grain boundary is observed inside the ferrite particles. It is also known from FIG. 3 that the ferrite particles of Example 1 are single crystals. When the ferrite particles of Example 2 were observed in the same manner as in Example 1, and it was found to have a similar particle shape and crystal form as those of the ferrite particles of Example 1.

As shown in Table 2, the ferrite particles of Examples 1 and 2 have a higher saturation magnetic flux density as compared with the Mn—Zn ferrite particles disclosed in Patent Literature 1.

On the other hand, in the ferrite particles of Comparative Example 1, the content of Fe is less than 44 mass %, the content of Zn is more than 11 mass %, and the content of Fe is lower and the content of Zn is higher than those of the ferrite particles of Examples 1 and 2. The ferrite particles of Comparative Example 1 have lower saturation magnetization and saturation magnetic flux density than those of the ferrite particles of Example 1 and Example 2.

The ferrite particles of Comparative Example 2 contain Fe and Mn but do not contain Zn, and the ferrite particles of Comparative Example 3 contain Fe but substantially do not contain Mn and Zn. Mn contained in the ferrite particles of Comparative Example 3 is considered to be an inevitable impurity derived from impurities contained in the iron oxide as a raw material. It is considered that the ferrite particles of Comparative Examples 2 and 3 are unfit for applications as a magnetic core or an inductor since they have a higher saturation magnetization and saturation magnetic flux density but a higher coercive force than those of the ferrite particles of Examples 1 and 2.

As shown in FIG. 4, the magnetic permeability (real part μ' of complex magnetic permeability) of the ferrite particles of Examples 1 and 2 is 5.5 to 6.5 in a frequency band of 1 to 100 MHz, reaches a peak of 6 to 7 in a frequency band of 200 to 300 MHz, gradually decreases when the frequency exceeds 300 MHz, and is about 3 at 1 GHz. From this, it is known that the ferrite particles of Examples 1 and 2 can reduce frequency variation of the magnetic permeability as compared with the Mn—Zn ferrite particles disclosed in Patent Literature 1. The ferrite particles of Examples 1 and 2 can provide a higher magnetic permeability as compared with the ferrite particles of Comparative Examples 1 and 3.

Furthermore, as shown in FIG. 5 and Table 3, the soft magnetic mixed powders of Examples 3 and 4 containing the ferrite particles of Examples 1 and 2 and the soft magnetic powder can achieve a higher volume resistance as compared with the soft magnetic powder alone as the soft magnetic mixed powder of Comparative Example 4.

Furthermore, as shown in FIG. 6 and Table 3, the soft magnetic mixed powders of Examples 3 and 4 containing the ferrite particles of Examples 1 and 2 and the iron powder can achieve a higher magnetic permeability (real part μ' of complex permeability) as compared with the soft magnetic powder alone of Comparative Example 4, and the actual measured value thereof is higher than the arithmetic calculation value. In contrast, the soft magnetic metal complex (soft magnetic mixed powder) disclosed in Patent Literature 2 contains a soft magnetic metal powder (soft magnetic powder) and a NiZn ferrite nanopowder as an insulator nanopowder, and has a lower magnetic permeability as compared with the soft magnetic metal powder alone. Therefore, it is known that the Mn—Zn ferrite particles of Examples 1 and 2 are different from the NiZn ferrite or the NiCuZn ferrite disclosed as the insulator nanopowder in Patent Literature 2, and the magnetic permeability can be improved when used together with a soft magnetic powder as compared with the soft magnetic powder alone.

Furthermore, from FIGS. 5 and 6, the soft magnetic mixed powder of Comparative Example 5 containing $TiO_2$ particles and the iron powder has a lower volume resistance and a lower magnetic permeability as compared with the soft magnetic mixed powders of Examples 3 and 4. The soft magnetic mixed powder of Comparative Example 6 containing $SiO_2$ particles and the iron powder has a significantly higher volume resistance but a lower magnetic permeability as compared with the soft magnetic mixed powders of Examples 3 and 4. From this, it is known that the powder to be combined with the soft magnetic powder is preferably the ferrite particles of Examples 1 and 2 rather than $TiO_2$ particles and $SiO_2$ particles, which have excellent effects of increasing the volume resistance and increasing the magnetic permeability.

INDUSTRIAL APPLICABILITY

The Mn—Zn ferrite particles according to the present invention has a high saturation magnetic flux density, and when mixed with a soft magnetic powder and used as the soft magnetic mixed powder, can provide a higher magnetic permeability as compared with the soft magnetic powder alone. Therefore, the ferrite particles are suitable for applications such as magnetic cores and inductors.

Furthermore, the Mn—Zn ferrite particles according to the present invention have an advantage in that the ferrite particles are difficult to aggregate when dispersed in a resin solution or in a dispersion medium since the particle diameter is small and the residual magnetization and the coercive force are small. Therefore, the ferrite particles can be suitably used in magnetic ink, a molding method using the magnetic ink, and a method for forming a circuit pattern.

Although the present invention has been described in detail by referring to specific embodiments, it will be apparent to those skilled in the an that various modifications and variations are possible without departing from the spirit and scope of the present invention.

The present application is based on Japanese Patent Application (No. 2017-190071) filed on Sep. 29, 2017, the content of which are incorporated herein by reference.

The invention claimed is:

1. Mn—Zn ferrite particles, comprising:
   44 mass % to 60 mass % of Fe;
   10 mass % to 16 mass % of Mn; and
   1 mass % to 11 mass % of Zn,
   wherein the ferrite particles are single crystals having an average particle diameter of 1 nm to 2,000 nm and have a polyhedral particle shape with an average sphericity of 0.85 or more and less than 0.95.

2. The Mn—Zn ferrite particles according to claim 1, wherein the ferrite particles have a saturation magnetization of 50 $Am^2$/kg to 65 $Am^2$/kg.

3. The Mn—Zn ferrite particles according to claim 1, wherein the ferrite particles have an average particle diameter of 5 nm to 1,500 nm.

4. A resin molded body comprising the Mn—Zn ferrite particles as described in claim 1.

5. A soft magnetic mixed powder comprising the Mn—Zn ferrite particles as described in claim 1 and a soft magnetic powder.

6. A magnetic core comprising the soft magnetic mixed powder as described in claim 5.

* * * * *